(12) United States Patent
Baek et al.

(10) Patent No.: US 12,469,750 B2
(45) Date of Patent: Nov. 11, 2025

(54) METHOD OF EXTRACTING PROPERTIES OF A LAYER ON A WAFER

(71) Applicant: SAMSUNG ELECTRONICS CO., LTD., Suwon-si (KR)

(72) Inventors: Inkeun Baek, Suwon-si (KR); Suhwan Park, Suwon-si (KR); Ikseon Jeon, Suwon-si (KR); Namil Koo, Suwon-si (KR); Ingi Kim, Suwon-si (KR); Jaeho Kim, Suwon-si (KR); Junbum Park, Suwon-si (KR); Sunhong Jun, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 353 days.

(21) Appl. No.: 18/202,650

(22) Filed: May 26, 2023

(65) Prior Publication Data

US 2024/0136232 A1    Apr. 25, 2024
US 2024/0234216 A9    Jul. 11, 2024

(30) Foreign Application Priority Data

Oct. 25, 2022    (KR) .................... 10-2022-0138433

(51) Int. Cl.
*H01L 21/66* (2006.01)
*G01N 21/95* (2006.01)

(52) U.S. Cl.
CPC ......... *H01L 22/12* (2013.01); *G01N 21/9501* (2013.01)

(58) Field of Classification Search
CPC ............. H01L 22/12; G01N 21/9501; G01N 21/3563; G01N 21/55; G01N 21/59
See application file for complete search history.

(56) References Cited

U.S. PATENT DOCUMENTS

| | | |
|---|---|---|
| 7,196,782 B2 | 3/2007 | Fielden et al. |
| 8,374,800 B2 | 2/2013 | Jepsen |
| 2007/0235650 A1* | 10/2007 | Federici .............. G01N 21/636 |
| | | 250/341.8 |
| 2021/0057262 A1 | 2/2021 | Nassau et al. |
| 2022/0268568 A1 | 8/2022 | Kim et al. |

FOREIGN PATENT DOCUMENTS

| | | | |
|---|---|---|---|
| JP | 2003075761 A | * | 3/2003 |
| KR | 19990034509 U | * | 8/1999 |
| KR | 10-2015-0097116 A | | 8/2015 |
| KR | 10-1602733 B1 | | 3/2016 |
| KR | 10-1739628 B1 | | 5/2017 |
| KR | 10-2140588 B1 | | 8/2020 |
| KR | 10-2167799 B1 | | 10/2020 |
| KR | 10-2021-0024319 A | | 3/2021 |

* cited by examiner

*Primary Examiner* — Edwin C Gunberg
*Assistant Examiner* — Richard O Toohey
(74) *Attorney, Agent, or Firm* — Sughrue Mion, PLLC

(57) ABSTRACT

Provided is a method of extracting properties of a layer on a wafer, the method including emitting electromagnetic waves to a lower surface of the wafer, detecting a first electromagnetic wave, that passes through a target layer on an upper surface of the wafer, and a second electromagnetic wave, that is reflected from the target layer, among the electromagnetic waves to obtain data including information about the first electromagnetic wave and the second electromagnetic wave, and separating a first pulse of the first electromagnetic wave and a second pulse of the second electromagnetic wave from each other in the data and obtaining property data of the target layer.

20 Claims, 4 Drawing Sheets

METHOD OF EXTRACTING PROPERTIES OF A LAYER ON A WAFER

CROSS-REFERENCE TO RELATED APPLICATION

This application claims priority to Korean Patent Application No. 10-2022-0138433, filed on Oct. 25, 2022 in the Korean Intellectual Property Office, the disclosure of which is incorporated herein by reference in its entirety.

BACKGROUND

1. Field

Example embodiments relate to a method of extracting properties of a layer on a wafer. More particularly, example embodiments relate to a method of extracting properties of a layer on a wafer in a non-contact manner.

2. Description of Related Art

In order to prevent damage of a layer on a wafer, properties of the layer may be extracted by a non-contact manner using an electromagnetic wave. The properties of the layer may be extracted from the electromagnetic wave passing through or reflected from the wafer and the layer.

According to related arts, an actual wafer used for manufacturing a semiconductor device may include an electrical structure such as a partial impurity doping affecting a property measurement of the layer. Thus, the property of the layer such as a surface resistance of the layer may not be accurately measured.

SUMMARY

Example embodiments provide a method of more accurately extracting properties of a layer on a wafer by excluding an influence caused by an electrical structure of the wafer.

According to an aspect of an example embodiment, there is provided a method of extracting properties of a layer on a wafer, the method including emitting electromagnetic waves to a lower surface of the wafer, detecting a first electromagnetic wave, that passes through a target layer on an upper surface of the wafer, and a second electromagnetic wave, that is reflected from the target layer, among the electromagnetic waves to obtain data including information about the first electromagnetic wave and the second electromagnetic wave, and separating a first pulse of the first electromagnetic wave and a second pulse of the second electromagnetic wave from each other in the data and obtaining property data of the target layer.

According to another aspect of an example embodiment, there is provided a method of extracting properties of a target layer on a wafer, the method including emitting electromagnetic waves to a lower surface of the wafer in a direction perpendicular to the lower surface of the wafer, simultaneously detecting a first electromagnetic wave, that passes through a layer and the target layer sequentially formed on an upper surface of the wafer, and a second electromagnetic wave, that is reflected from the target layer, among the electromagnetic waves to obtain data including information about the first electromagnetic wave and the second electromagnetic wave, separating a first pulse of the first electromagnetic wave and a second pulse of the second electromagnetic wave from each other, obtaining a first transmission coefficient of the target layer with respect to the first electromagnetic wave from the separated first pulse and the second pulse, obtaining a second transmission coefficient of the target layer with respect to the second electromagnetic wave from the first transmission coefficient, and dividing the second transmission coefficient by the first transmission coefficient.

According to another aspect of an example embodiment, there is provided a method of extracting properties of a target layer on a wafer, the method including emitting electromagnetic waves to a lower surface of the wafer, detecting a first electromagnetic wave, that passes through the target layer on an upper surface of the wafer, and a second electromagnetic wave, that is reflected from the target layer, among the electromagnetic waves to obtain data comprising information about the first electromagnetic wave and the second electromagnetic wave, and separating a first pulse of the first electromagnetic wave and a second pulse of the second electromagnetic wave from each other in the data, and obtaining property data of the target layer. The emitting the electromagnetic waves comprises emitting the electromagnetic waves in a direction perpendicular to the lower surface of the wafer. The detecting the second electromagnetic wave comprises reflecting the electromagnetic wave passing through the target layer toward the target layer.

BRIEF DESCRIPTION OF DRAWINGS

Example embodiments will be more clearly understood from the following detailed description taken in conjunction with the accompanying drawings.

FIG. 1 illustrates an apparatus for extracting properties of a layer on a wafer in accordance with example embodiments;

FIG. 2 is a graph showing data of a target layer obtained using the apparatus in FIG. 1;

FIG. 3 is a graph showing a first pulse of a first electromagnetic wave and a second pulse of a second electromagnetic wave separated from the data in FIG. 2;

FIG. 4 is a flow chart illustrating a method of extracting properties of a layer on a wafer using the apparatus in FIG. 1; and FIG. 5 illustrates an apparatus for extracting properties of a layer on a wafer in accordance with example embodiments.

DETAILED DESCRIPTION OF EMBODIMENTS

Hereinafter, example embodiments will be explained in detail with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
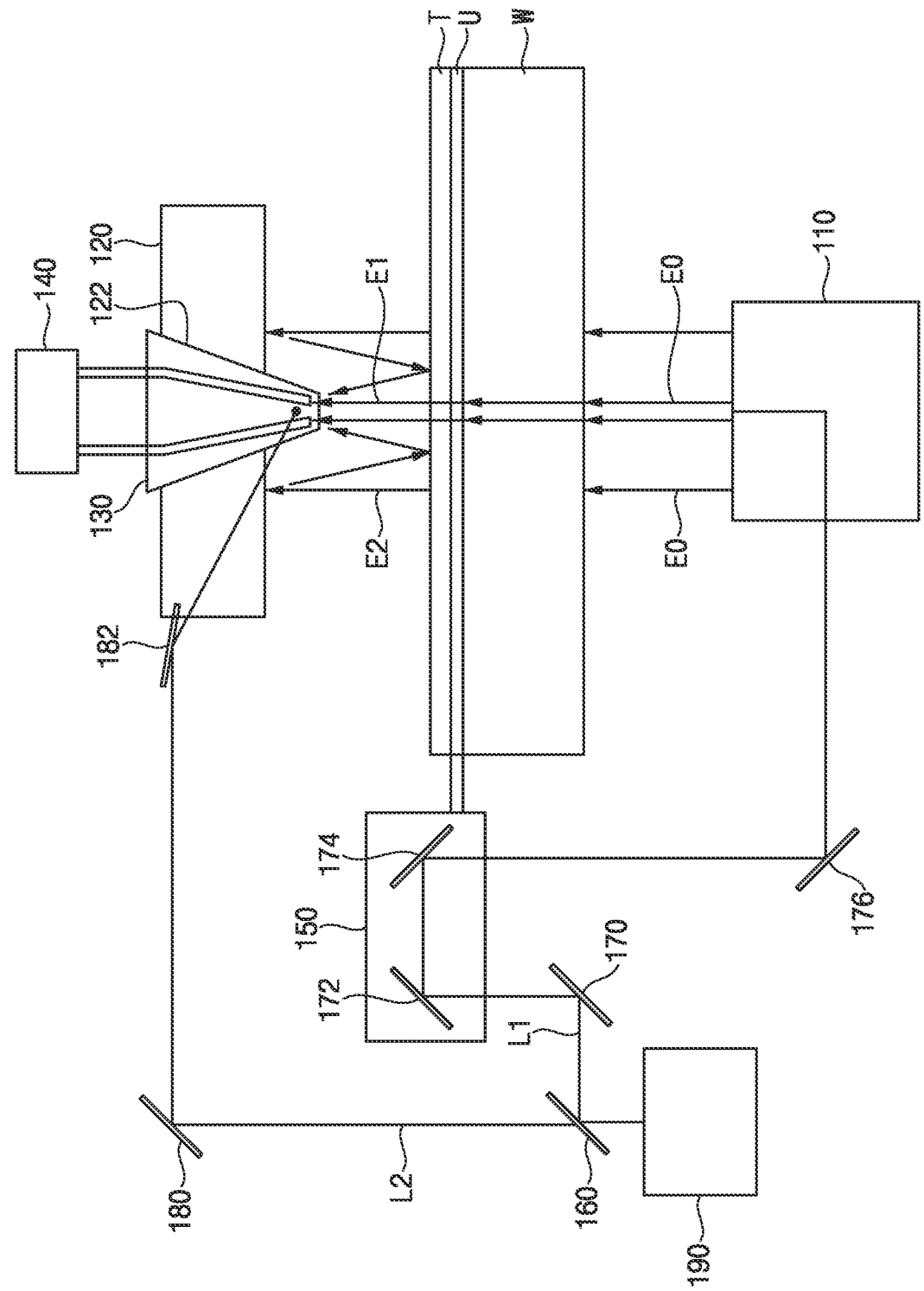
FIGS. 1 to 5 represent non-limiting, example embodiments as described herein.

FIG. 1 illustrates an apparatus for extracting properties of a layer on a wafer in accordance with example embodiments.

An apparatus 100 for extracting properties of a layer on a wafer may extract a property of a target layer T on an upper surface of the wafer W by a non-contact method using electromagnetic waves. Further, at least one layer U may be interposed between the wafer W and the target layer T. Information of a property of the layer U may not be recognized. The apparatus 100 may exclude an influence of the wafer W and the layer U on the target layer T to more accurately extract the properties of the target layer T.

Referring to FIG. 1, the apparatus 100 may include an emitter 110, a reflector 120, a detector 130, a processor 140 and a laser device.

The emitter 110 may be arranged under the wafer W. The emitter 110 may be an electromagnetic wave generator which is configured to emit electromagnetic waves E0 to a lower surface of the wafer W. In example embodiments, the emitter 110 may emit the electromagnetic waves E0 to the lower surface of the wafer W in a direction substantially perpendicular to the lower surface of the wafer W. Thus, the electromagnetic waves E0 may penetrate the upper surface of the wafer W, the layer U and the target layer T through an interior of the wafer W in a vertical direction.

The reflector 120 may be arranged above the wafer W opposite to the emitter 110. The reflector 120 may reflect a part of the electromagnetic waves, which may penetrate the wafer W, the layer U and the target layer T, toward an upper surface of the target layer T. In example embodiments, the reflector 120 may be substantially parallel to the upper surface of the wafer W. For example, the reflector 120 may include a mirror, a metal plate or an equivalent structure that may be able to reflect an electromagnetic wave.

In example embodiments, the reflector 120 may include an opening 122. The opening 122 may be formed through a central portion of the reflector 120 in the vertical direction. The width of the opening 122 may gradually decrease from top to bottom, but embodiments are not limited thereto. For example, a width of the opening 122 may gradually increase from top to bottom. Further, the opening 122 may have a uniform width.

The detector 130 may include a probe which is arranged in the opening 122 of the reflector 120. The detector 130 may detect a first electromagnetic wave E1, which may penetrate the wafer W, the layer U and the target layer T, and a second electromagnetic wave E2, which may be reflected from the reflector 120, among the electromagnetic waves E0 emitted from the emitter 110. The first electromagnetic wave E1 and the second electromagnetic wave E2 may include data with respect to the properties of the target layer T. The detector 130 may include a sensor, a camera, etc. that may detect electromagnetic waves.

In example embodiments, the detector 130 may be partially protrude downward from a lower surface of the reflector 120 through the opening 122. Thus, a lower end of the detector 130 may be lower than the lower surface of the reflector 120. For example, a distance between the lower end of the detector 130 and the target layer T may be shorter than a distance between the lower surface of the reflector 120 and the target layer T.

Because the detector 130 may be positioned at the central portion of the reflector 120, i.e., above a central portion of the wafer W, the first electromagnetic wave E1 penetrating the central portion of the wafer W may be directly incident on the detector 130. In contrast, the second electromagnetic wave E2 penetrating an edge portion of the wafer W may be reflected from the reflector 130 toward the target layer T. The detector 130 may detect the second electromagnetic wave E2 reflected from the target layer T.

Thus, the first electromagnetic wave E1 may be directly incident on the detector 130 through the target layer T. The second electromagnetic wave E2 may be reflected from the reflector 120. The second electromagnetic wave E2 may then be reflected from the target layer T. The second electromagnetic wave E2 may be incident on the detector 130. Therefore, a first pulse P1 of the first electromagnetic wave E1 may be different from a second pulse P2 of the second electromagnetic wave E2. For example, the first pulse P1 may have a first peak. The second pulse P2 may have a second peak. The first peak may be higher than the second peak, but embodiments are not limited thereto. For example, the first peak may be lower than the second peak.

A time for detecting the second electromagnetic wave E2 by the detector 130 may be later than a time for detecting the first electromagnetic wave E1 by the detector 130. For example, a time delay may be generated between the detection times of the first electromagnetic wave E1 and the second electromagnetic wave E2 by the detector 130. In order to simultaneously detect the first electromagnetic wave E1 and the second electromagnetic wave E2 having the time delay, a laser device may provide operation times of the emitter 110 and the detector 130 with the time delay.

The processor 140 may be physically implemented by analog and/or digital circuits including one or more of a logic gate, an integrated circuit, a microprocessor, a microcontroller, a memory circuit, a passive electronic component, an active electronic component, an optical component, and the like, and may be driven by firmware and software configured to perform the functions or operations described herein. According to an example embodiment, the processor 140 may include an application processor or an image processor.

The laser device may be configured to control operation of the emitter 110 and the detector 130. Further, the laser device may have a time domain spectroscopy function. In example embodiments, the laser device may include a laser source 190, a beam splitter 160, an optical delay scanning stage 150, etc.

The laser source 190 may be configured to generate a laser. The laser source 190 may include various types of laser source for generating the laser.

The beam splitter 160 may split the laser generated from the laser source 190 into a first laser L1 and a second laser L2. The first laser L1 may be incident on the optical delay scanning stage 150 by a first mirror 170.

The optical delay scanning stage 150 may include a second mirror 172 and a third mirror 174 opposite to each other. The first laser L1 reflected from the first mirror 170 may be reflected from the second mirror 172 toward the third mirror 174. The reflection of the first laser L1 may provide the first laser L1 with the time delay corresponding to a time difference between the first pulse P1 and the second pulse P2. The third mirror 174 may reflect the first laser L1 toward a fourth mirror 176. The first laser L1 reflected from the fourth mirror 176 may be incident on the emitter 110 such that the emitter 110 may be operated.

The second laser L2 may be incident on a fifth mirror 180. The second laser L2 reflected from the fifth mirror 180 may be reflected from a sixth mirror 182. The second laser L2 may then be incident on the detector 130.

In example embodiments, the laser device may include a first mirror 170, a second mirror 172, a third mirror 174, a fourth mirror 176, a fifth mirror 178, and a sixth mirror 180, but embodiments are not limited thereto. The first to sixth mirrors 170, 172, 174, 176, 178 and 180 may be set in accordance with positions of the laser source 190, the optical delay scanning stage 150, the emitter 110 and the detector 130. Thus, the laser device may include no more than five mirrors or at least seven mirrors.

Figure 2:
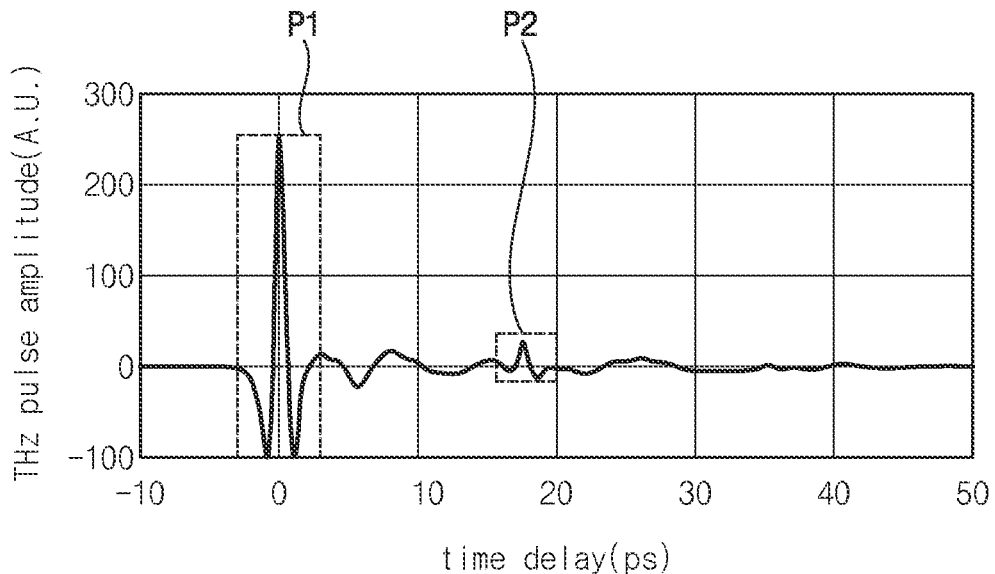

FIG. 2 is a graph showing data of a target layer obtained using the apparatus in FIG. 1.

Referring to FIG. 2, the detector 130 may simultaneously detect the first electromagnetic wave E1 and the second electromagnetic wave E2. Thus, the data of the target layer T obtained by the detector 130 may include the first pulse P1 of the first electromagnetic wave E1 and the second pulse P2 of the second electromagnetic wave E2. The time delay may exist between the first pulse P1 and the second pulse P2.

Figure 3:
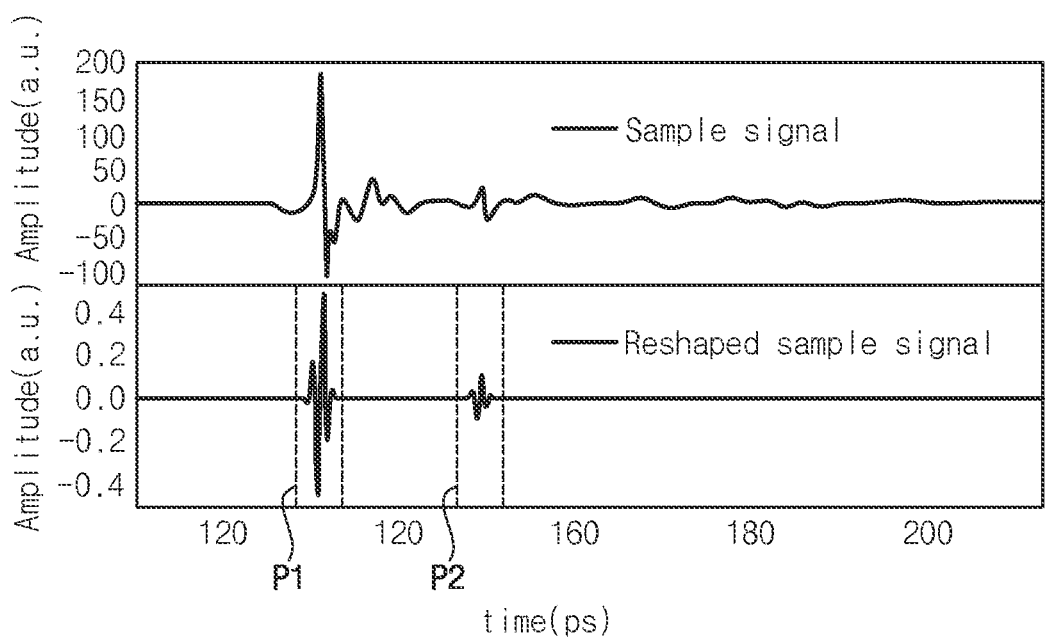

FIG. 3 is a graph showing a first pulse of a first electromagnetic wave and a second pulse of a second electromagnetic wave separated from the data in FIG. 2.

Referring to FIG. 3, the processor 140 may separate the first pulse P1 of the first electromagnetic wave E1 and the second pulse P2 of the second electromagnetic wave E2 from each other. The processor 140 may obtain property data of the target layer T based on a spectrum of the first pulse P1 and the second pulse P2.

The processor 140 may calculate and obtain a first transmission coefficient of the target layer T with respect to the first electromagnetic wave E1. For example, the processor 140 may calculate and obtain the first transmission coefficient of the target layer T with respect to the first electromagnetic wave E1 using variables such as a transmission coefficient of the target layer T, a transmission coefficient of the wafer W, an absorption amount of electromagnetic wave of the wafer W, a quantity of electricity of an electromagnetic wave, etc. For example, the processor 140 may multiply the transmission coefficient of the target layer T, the transmission coefficient of the wafer W, the absorption amount of electromagnetic wave of the wafer W, the quantity of electricity of the electromagnetic wave by the detection time of the first electromagnetic wave E1 to obtain the first transmission coefficient of the target layer T.

The processor 140 may calculate and obtain a second transmission coefficient of the target layer T with respect to the second electromagnetic wave E2 from the first transmission coefficient. Particularly, the processor 140 may calculate and obtain the second transmission coefficient of the target layer T with respect to the second electromagnetic wave E2 using variables such as the variables used for calculating the first transmission coefficient, a reflection coefficient of the reflector 120, a coefficient for representing geometrical characteristics between the reflector 120 and the detector 130, etc. For example, the variables used for calculating the second transmission coefficient of the target layer T may include the variables used for calculating the first transmission coefficient of the target layer T.

The processor 140 may divide the second transmission coefficient by the first transmission coefficient. As mentioned above, the variables used for calculating the second transmission coefficient of the target layer T may include the variables used for calculating the first transmission coefficient of the target layer T, the second transmission coefficient may be divided by the first transmission coefficient to remove same variables. The same variables that are removed may include data with respect to the wafer W and the layer U.

Therefore, a value obtained by dividing the second transmission coefficient by the first transmission coefficient may not include the data with respect to the wafer W and the layer U. For example, the properties of the wafer W and the layer U may not affect the data of the target layer T. As a result, the data processed by the processor 140 may more accurately include only the properties of the target layer T.

Further, because the data with respect to the wafer W may be removed, an electromagnetic wave penetrating the wafer W may not be used as a reference signal. Thus, a process for setting the reference signal from the wafer W when measuring the properties of the target layer T may be omitted.

The processor 140 may obtain a surface resistance of the target layer T from the value obtaining by dividing the second transmission coefficient by the first transmission coefficient. For example, the processor 140 may obtain the surface resistance of the target layer T among the properties of the target layer T from the value obtained by dividing the second transmission coefficient by the first transmission coefficient.

Figure 4:
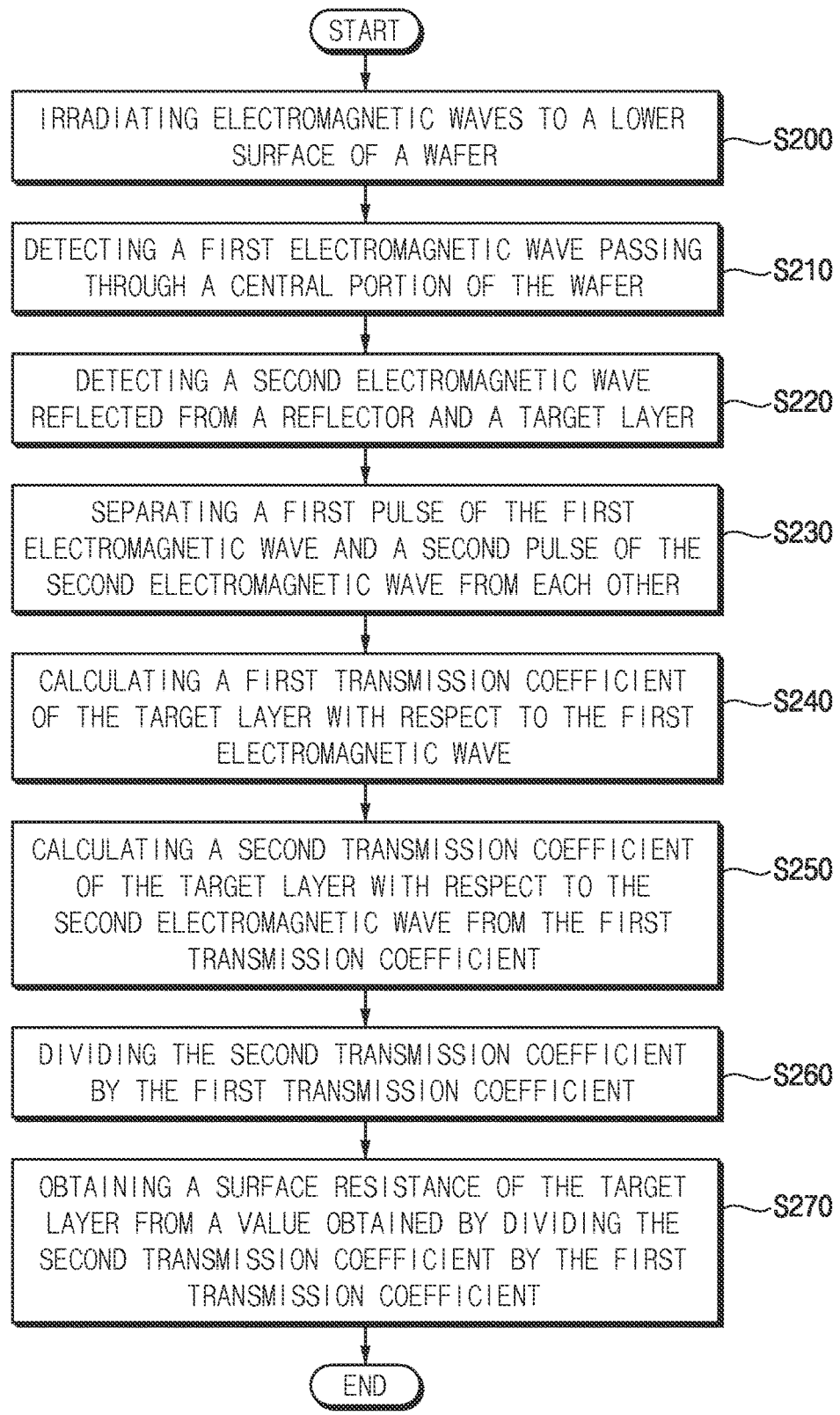

FIG. 4 is a flow chart illustrating a method of extracting properties of a layer on a wafer using the apparatus in FIG. 1.

Referring to FIGS. 1 and 4, in step S200, the emitter 110 may emit the electromagnetic waves E0 to the lower surface of the wafer W in the vertical direction.

In step S210, the detector 130 may detect the first electromagnetic wave E1 passing through the central portion of the wafer. As mentioned above, the first electromagnetic wave E1 may have the first pulse P1.

In step S220, the second electromagnetic wave E2 passing through the edge portion of the wafer W may be reflected from the reflector 20 toward the target layer T. The detector 130 may detect the second electromagnetic wave E2 reflected from the target layer T. As mentioned above, the second electromagnetic wave E2 may have the second pulse P2 lower than the first pulse P1. The first pulse P1 may have the first peak. The second pulse P2 may have the second peak lower than the first peak.

Further, the detector 130 may simultaneously detect the first electromagnetic wave E1 and the second electromagnetic wave E2 by the laser device having the time domain spectroscopy function.

In step S230, the processor 140 may separate the first pulse P1 of the first electromagnetic wave E1 and the second pulse P2 of the second electromagnetic wave E2 from each other.

In step S240, the processor 140 may calculate and obtain the first transmission coefficient of the target layer T with respect to the first electromagnetic wave E1. For example, the processor 140 may calculate and obtain the first transmission coefficient of the target layer T with respect to the first electromagnetic wave E1 using the variables such as the transmission coefficient of the target layer T, the transmission coefficient of the wafer W, the absorption amount of electromagnetic wave of the wafer W, the quantity of electricity of an electromagnetic wave, etc. For example, the processor 140 may multiply the transmission coefficient of the target layer T, the transmission coefficient of the wafer W, the absorption amount of electromagnetic wave of the wafer W, the quantity of electricity of the electromagnetic wave by the detection time of the first electromagnetic wave E1 to obtain the first transmission coefficient of the target layer T.

In step S250, the processor 140 may calculate and obtain a second transmission coefficient of the target layer T with respect to the second electromagnetic wave E2 from the first transmission coefficient. For example, the processor 140 may calculate and obtain the second transmission coefficient of the target layer T with respect to the second electromagnetic wave E2 using the variables such as the variables used for calculating the first transmission coefficient, the reflection coefficient of the reflector 120, the coefficient for representing the geometrical characteristics between the reflector 120 and the detector 130, etc.

In step S250, the processor 140 may divide the second transmission coefficient by the first transmission coefficient. The second transmission coefficient may be divided by the first transmission coefficient to remove same variables. The same variables that are removed may include data with respect to the wafer W and the layer U.

Therefore, a value obtained by dividing the second transmission coefficient by the first transmission coefficient may not include the data with respect to the wafer W and the layer U. For example, the properties of the wafer W and the layer U may not affect the data of the target layer T. As a result, the data processed by the processor 140 may more accurately include only the properties of the target layer T. Further, because the data with respect to the wafer W may be removed, an electromagnetic wave penetrating the wafer W may not be used as a reference signal. Thus, a process for setting the reference signal from the wafer W when measuring the properties of the target layer T may be omitted.

In step S270, the processor 140 may obtain a surface resistance of the target layer T from the value obtaining by dividing the second transmission coefficient by the first transmission coefficient. For example, the processor 140 may obtain the surface resistance of the target layer T among the properties of the target layer T from the value obtained by dividing the second transmission coefficient by the first transmission coefficient.

Figure 5:
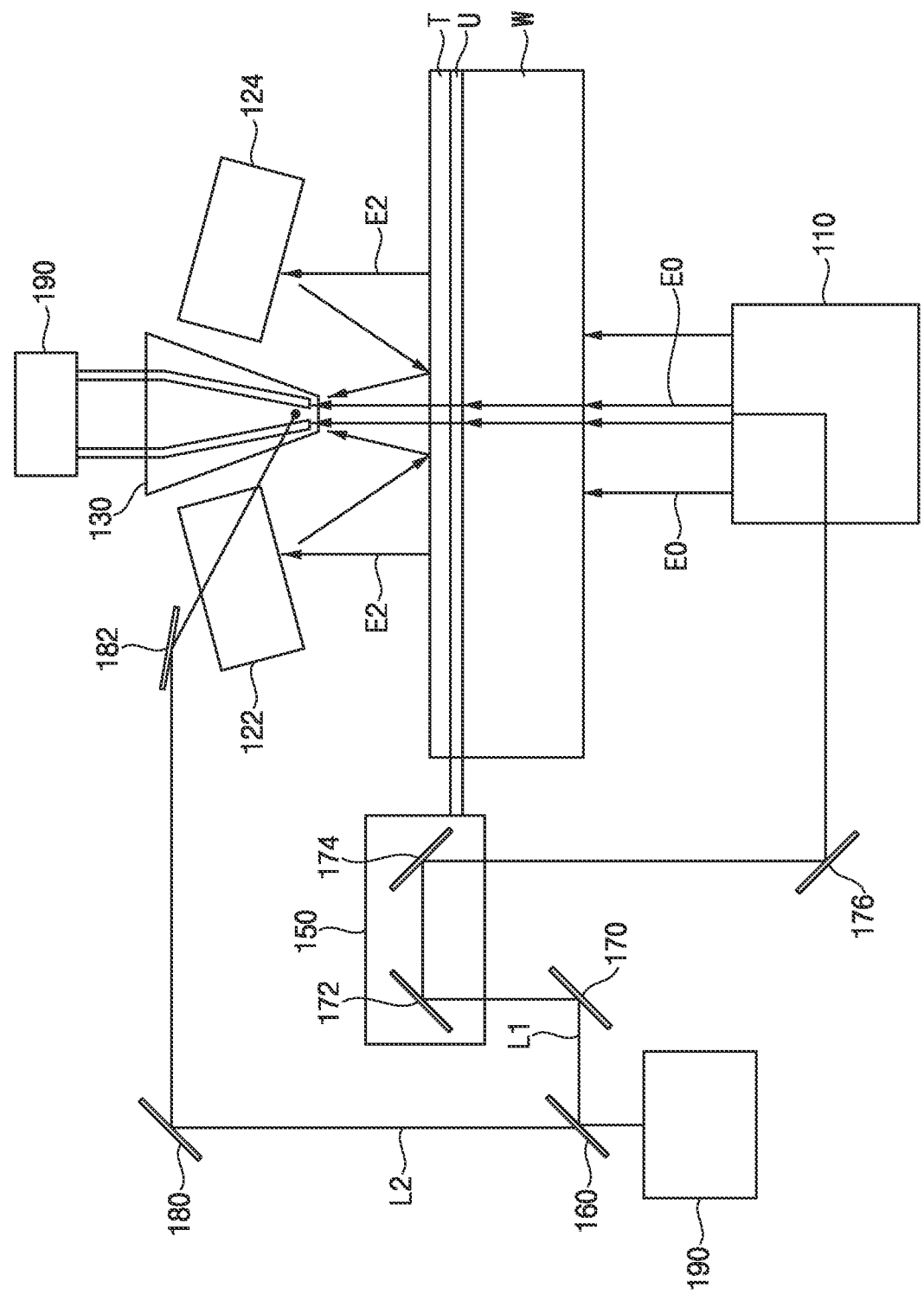

FIG. 5 illustrates an apparatus for extracting properties of a layer on a wafer in accordance with example embodiments.

An apparatus 100*a* of example embodiments may include elements substantially the same as those of the apparatus 100 in FIG. 1 except for a reflector. The same reference numerals may refer to the same elements and any further illustrations with respect to the same elements may be omitted herein for brevity.

Referring to FIG. 5, an apparatus 100*a* of example embodiments may include a first reflector 122 and a second reflector 124. The first reflector 122 and the second reflector 124 may be spaced apart from each other above the wafer W. The detector 130 may be arranged between the first reflector 122 and the second reflector 124.

In example embodiments, the first reflector 122 and the second reflector 124 may be inclined with respect to the upper surface of the wafer W. The first reflector 122 may reflect the second electromagnetic wave E2, which may pass through a left edge portion of the wafer W, toward the central portion of the target layer T. The second reflector 124 may reflect the second electromagnetic wave E2, which may pass through a right edge portion of the wafer W, toward the central portion of the target layer T.

According to example embodiments, the first pulse of the first electromagnetic wave and the second pulse of the second electromagnetic wave may be separated from the data including information about the first electromagnetic wave and the second electromagnetic wave to obtain the property data of the target layer. For example, after the first transmission coefficient of the target layer with respect to the first electromagnetic wave and the second transmission coefficient of the target layer with respect to the second electromagnetic wave are calculated and obtained from the separated first and second pulses, the second transmission coefficient may be divided by the first transmission coefficient to remove a variable for representing the property of the wafer so that an influence of the wafer on the property data of the target layer may be excluded. As a result, the property of the target layer may be more accurately extracted.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present disclosure as defined in the claims and their equivalents. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A method of extracting properties of a target layer on a wafer, the method comprising:
    emitting electromagnetic waves to a lower surface of the wafer;
    detecting a first electromagnetic wave, that passes through the target layer on an upper surface of the wafer, and a second electromagnetic wave, that is reflected from the target layer, among the electromagnetic waves to obtain data comprising information about the first electromagnetic wave and the second electromagnetic wave; and
    separating a first pulse of the first electromagnetic wave and a second pulse of the second electromagnetic wave from each other in the data, and obtaining property data of the target layer.

2. The method of claim 1, wherein the emitting the electromagnetic waves comprises emitting the electromagnetic waves in a direction perpendicular to the lower surface of the wafer.

3. The method of claim 1, wherein the detecting the second electromagnetic wave comprises reflecting an electromagnetic wave among the electromagnetic waves, passing through the target layer, toward the target layer.

4. The method of claim 1, wherein the detecting the first electromagnetic wave and the second electromagnetic wave comprises simultaneously detecting the first electromagnetic wave and the second electromagnetic wave.

5. The method of claim 1, wherein the obtaining the property data of the target layer comprises:
    obtaining a first transmission coefficient of the target layer with respect to the first electromagnetic wave;
    obtaining a second transmission coefficient of the target layer with respect to the second electromagnetic wave from the first transmission coefficient; and
    dividing the second transmission coefficient by the first transmission coefficient.

6. The method of claim 5, wherein the first transmission coefficient is obtained based on variables comprising a transmission coefficient of the target layer, a transmission coefficient of the wafer, an absorption amount of the electromagnetic waves of the wafer and a quantity of electricity of the electromagnetic waves.

7. The method of claim 6, wherein the second transmission coefficient is obtained based on variables comprising the variables used for obtaining the first transmission coefficient and a reflection coefficient of a reflector configured to reflect an electromagnetic wave among the electromagnetic waves to the target layer.

8. The method of claim 5, wherein the obtaining the property data of the target layer further comprises obtaining a surface resistance of the target layer from a value obtained by dividing the second transmission coefficient by the first transmission coefficient.

9. The method of claim 1, wherein a layer is interposed between the wafer and the target layer.

10. A method of extracting properties of a target layer on a wafer, the method comprising:
    emitting electromagnetic waves to a lower surface of the wafer in a direction perpendicular to the lower surface of the wafer;
    simultaneously detecting a first electromagnetic wave, that passes through a layer and the target layer sequentially formed on an upper surface of the wafer, and a second electromagnetic wave, that is reflected from the target layer, among the electromagnetic waves to obtain data comprising information about the first electromagnetic wave and the second electromagnetic wave;
    separating a first pulse of the first electromagnetic wave and a second pulse of the second electromagnetic wave from each other;
    obtaining a first transmission coefficient of the target layer with respect to the first electromagnetic wave from the separated first pulse and the second pulse;
    obtaining a second transmission coefficient of the target layer with respect to the second electromagnetic wave from the first transmission coefficient; and
    dividing the second transmission coefficient by the first transmission coefficient.

11. The method of claim 10, wherein the first transmission coefficient is obtained based on variables comprising a transmission coefficient of the target layer, a transmission coefficient of the wafer, an absorption amount of the electromagnetic waves of the wafer and a quantity of electricity of the electromagnetic waves.

12. The method of claim 11, wherein the second transmission coefficient is obtained based on variables comprising the variables used for obtaining the first transmission coefficient and a reflection coefficient of a reflector configured to reflect an electromagnetic wave among the electromagnetic waves, that passes through the target layer, to the target layer.

13. The method of claim 10, further comprising obtaining a surface resistance of the target layer from a value obtained by dividing the second transmission coefficient by the first transmission coefficient.

14. A method of extracting properties of a target layer on a wafer, the method comprising:
    emitting electromagnetic waves to a lower surface of the wafer;
    detecting a first electromagnetic wave, that passes through the target layer on an upper surface of the wafer, and a second electromagnetic wave, that is reflected from the target layer, among the electromagnetic waves to obtain data comprising information about the first electromagnetic wave and the second electromagnetic wave; and
    separating a first pulse of the first electromagnetic wave and a second pulse of the second electromagnetic wave from each other in the data, and obtaining property data of the target layer,
    wherein the emitting the electromagnetic waves comprises emitting the electromagnetic waves in a direction perpendicular to the lower surface of the wafer, and
    wherein the detecting the second electromagnetic wave comprises reflecting the electromagnetic wave passing through the target layer toward the target layer.

15. The method of claim 14, wherein the detecting the first electromagnetic wave and the second electromagnetic wave comprises simultaneously detecting the first electromagnetic wave and the second electromagnetic wave.

16. The method of claim 14, wherein the obtaining the property data of the target layer comprises:
    obtaining a first transmission coefficient of the target layer with respect to the first electromagnetic wave;
    obtaining a second transmission coefficient of the target layer with respect to the second electromagnetic wave from the first transmission coefficient; and
    dividing the second transmission coefficient by the first transmission coefficient.

17. TThe method of claim 16, wherein the first transmission coefficient is obtained based on variables comprising a transmission coefficient of the target layer, a transmission coefficient of the wafer, an absorption amount of the electromagnetic waves of the wafer and a quantity of electricity of the electromagnetic waves.

18. The method of claim 17, wherein the second transmission coefficient is obtained based on variables comprising the variables used for obtaining the first transmission coefficient and a reflection coefficient of a reflector configured to reflect an electromagnetic wave among the electromagnetic waves, that passes through the target layer, to the target layer.

19. The method of claim 16, wherein the obtaining the property data of the target layer further comprises obtaining a surface resistance of the target layer from a value obtained by dividing the second transmission coefficient by the first transmission coefficient.

20. The method of claim 14, wherein a layer is interposed between the wafer and the target layer.

\* \* \* \* \*